US012336060B2

(12) United States Patent
Bilhöfer

(10) Patent No.: US 12,336,060 B2
(45) Date of Patent: Jun. 17, 2025

(54) ELECTRIC HEATING DEVICE FOR A MOTOR VEHICLE

(71) Applicant: Eberspächer catem GmbH & Co. KG, Herxheim (DE)

(72) Inventor: Andreas Bilhöfer, Schifferstadt (DE)

(73) Assignee: Eberspächer catem GmbH & Co. KG, Herxheim (DE)

( * ) Notice: Subject to any disclaimer, the term of this patent is extended or adjusted under 35 U.S.C. 154(b) by 1161 days.

(21) Appl. No.: 17/104,020

(22) Filed: Nov. 25, 2020

(65) Prior Publication Data

US 2021/0160966 A1    May 27, 2021

(30) Foreign Application Priority Data

Nov. 27, 2019    (DE) .................. 10 2019 218 348.4

(51) Int. Cl.
*H05B 1/02* (2006.01)
*B60H 1/22* (2006.01)
(Continued)

(52) U.S. Cl.
CPC ......... *H05B 1/0236* (2013.01); *B60H 1/2218* (2013.01); *B60R 16/03* (2013.01); *H03K 17/567* (2013.01); *H03K 17/605* (2013.01); *H03K 17/6871* (2013.01); *H03K 17/689* (2013.01); *H05B 3/0019* (2013.01); *B60L 58/20* (2019.02);
(Continued)

(58) Field of Classification Search
CPC ............... H05B 1/0246; H05B 3/0019; H05B 2203/005; H05B 2203/02; B60H 1/2218; B60R 16/03; H03K 17/567; H03K 17/605; H03K 17/6871; H03K 17/689
See application file for complete search history.

(56) References Cited

U.S. PATENT DOCUMENTS 5,834,131 A * 11/1998 Lutz .................. G05D 23/00
                                                    429/7
6,608,291 B1 * 8/2003 Collins .................. H05B 6/06
                                                    219/662
(Continued)

FOREIGN PATENT DOCUMENTS

CN    105408171 A    3/2016
CN    105966199 A    9/2016
(Continued)

*Primary Examiner* — Menatoallah Youssef
*Assistant Examiner* — Khareem E Almo
(74) *Attorney, Agent, or Firm* — The Webb Law Firm

(57) ABSTRACT

The present invention relates to a heating device for a motor vehicle with a dual-voltage vehicle electrical system. The heating device is operated with a power supply from the sub-system with the higher nominal voltage (for example 48 V), but actuated by a control device in the sub-system with the lower nominal voltage (for example 12 V). For this purpose, the heating device has a supply connection in the sub-system with the higher nominal voltage and a control connection in the sub-system with the lower nominal voltage. The control connection is disposed in particular on a control device which is integrated into the heating device and which is connected to a control connection of a switching element (power semiconductor) for controlling the heating device via a capacitive separating element in order to ensure potential isolation of the two sub-systems.

13 Claims, 9 Drawing Sheets

(51) Int. Cl.
  *B60L 58/20* (2019.01)
  *B60R 16/03* (2006.01)
  *H03K 17/567* (2006.01)
  *H03K 17/605* (2006.01)
  *H03K 17/687* (2006.01)
  *H03K 17/689* (2006.01)
  *H05B 3/00* (2006.01)

(52) U.S. Cl.
  CPC .... *H05B 2203/005* (2013.01); *H05B 2203/02* (2013.01); *H05B 2203/023* (2013.01)

(56) References Cited

U.S. PATENT DOCUMENTS

| | | | |
|---|---|---|---|
| 9,975,502 | B2 | 5/2018 | Mijac et al. |
| 10,449,989 | B2 * | 10/2019 | Nishio ................ H05B 6/02 |
| 11,394,066 | B2 * | 7/2022 | Liu ................ H01M 10/633 |
| 12,054,071 | B2 * | 8/2024 | Cho ................ B60L 50/60 |
| 2011/0272391 | A1 * | 11/2011 | Zhu ................ F02N 11/0862 |
| | | | 219/205 |
| 2012/0286813 | A1 * | 11/2012 | Murphy ............ B60S 1/0829 |
| | | | 324/649 |
| 2016/0159296 | A1 | 6/2016 | Mijac et al. |

FOREIGN PATENT DOCUMENTS

| | | |
|---|---|---|
| DE | 102007050821 A1 | 4/2009 |
| DE | 202013002716 U1 | 4/2013 |
| DE | 102013012615 A1 | 1/2015 |
| DE | 102014215666 A1 | 2/2016 |
| EP | 2206213 B1 | 7/2010 |
| EP | 2711248 A1 | 3/2014 |

\* cited by examiner

ELECTRIC HEATING DEVICE FOR A MOTOR VEHICLE

CROSS-REFERENCE TO RELATED APPLICATION

This application claims priority to German Patent Application No. 10 2019 218 348.4 filed Nov. 27, 2019, the disclosure of which is hereby incorporated by reference in its entirety.

BACKGROUND OF THE INVENTION

Field of the Invention

The present invention relates to an electric heating device for a motor vehicle. The invention relates in particular to an electric heating device for a motor vehicle with a vehicle electrical system in which two different voltage sources (batteries) provide different direct voltages side by side, wherein within each of them a respective number of consumers are operated in a corresponding sub-system of the motor vehicle electrical system ("dual-voltage vehicle electrical system").

Description of Related Art

In general, a motor vehicle electrical system is used to supply a plurality of control devices and signal components in a motor vehicle with current. The current is either taken from a battery as an energy storage or, when the motor vehicle engine is in operation, from a generator (alternator). A plurality of individual consumers (electrical vehicle components) can be supplied with power from the vehicle electrical system via individual load circuits through relays or an electrical power distributor with semiconductor switches.

Conventional vehicle electrical systems are based on a nominal battery voltage of 12 V (volts).

A special situation arises in vehicles with an electric drive (electric and hybrid vehicles) in which the battery (accumulator) not only serves to supply energy to the conventional electric vehicle components, but beyond that has to provide traction energy. Voltages of vehicle electrical systems in the automotive high-voltage range (above 60 V) are generally common in such vehicles, in particular in the range from 200 to 500 volts (e.g. 300 volts, 380 volts or 500 volts).

Another advantage of higher voltage is that the current required at high outputs is significantly lower than in a conventional 12-volt electrical system. However, the safety measures to be provided are very complex.

The development in recent years has therefore been to increase the voltage in vehicle electrical systems in conventional vehicles as well. Initially, the focus was on considerations to generally increase the voltage of the vehicle electrical system (e.g. to change over from a 14 V to a 42 V system). However, such a solution has the disadvantage that conventional components designed for a system voltage of, for example, 12 V or 14 V can no longer be used.

Therefore, more recent developments provide that vehicle electrical systems in the future will be provided with two sub-systems having different voltages (e.g. 12 V and 48 V or 14 V and 42 V). The sub-system with the higher voltage (e.g. 48 V) is intended for high-power consumers ("high-current consumers", for example motors, heaters and generators).

With the additional use of a 48 volt vehicle electrical system (in addition to the previous 12 volt vehicle electrical system) in the motor vehicle, e.g. the recommendation VDA 320 "Electrical and Electronic Components in the Motor Vehicle 48V Vehicle Electrical System (Elektrische and Elektronische Komponenten im Kraftfahrzeug 48V-Bordnetz)" (Verband der Automobilindustrie e.V., August 2014) stipulates high demands on safety.

This results, in particular, from the fact that power semiconductors are used for controlling consumers (in particular: heating devices) in the sub-system with the higher voltage (e.g. 48 V) and are controlled from the vehicle electrical system with the lower voltage (e.g. 12 V). These power semiconductors (e.g. MOSFET—Metal Oxide Semiconductor Field Effect Transistor or IGBT—Insulated Gate Bipolar Transistor) are therefore controlled from the 12 V electrical system, but switch currents of the 48 V electrical system.

It is to be noted that a 12 V vehicle electrical system and a 48 V vehicle electrical system are used here and in the following for the sake of simplicity, although these numbers are only exemplary and are used to designate a sub-system with a lower voltage and a sub-system with a higher voltage for the sake of simplicity. The invention is not restricted to the exemplary values mentioned above, but they are only examples of a sub-system with a lower and a sub-system with a higher voltage.

The points of contact of both electrical systems in the form of the power semiconductors involve the following risk: In the event of a fault ("break down of the power semiconductor"), the power semiconductor loses its control properties, as a result of which the higher voltage (for example 48 volts) is present at the control connection of the power semiconductor, consequently, the components of the 12 V sub-system (in particular consumers and other components of the control electronics) can be destroyed.

Galvanic de-coupling of the two sub-systems (12 V and 48 V) by way of a suitable transformer, in particular an opto-coupler, is therefore conventionally employed. Though opto-couplers enable galvanic isolation and can react very quickly in the event of a fault, they do incur high costs and require a relatively large amount of installation space. Alternatively, galvanic isolation can also be obtained using inductive couplers. However, they have the drawback that they react much more slowly.

SUMMARY OF THE INVENTION

The object of the present invention is to provide an improved heating device for a motor vehicle for use in a sub-system with a higher nominal voltage of a dual-voltage motor vehicle electrical system which can be controlled from a sub-system with a lower nominal voltage and overcomes the drawback of conventional transformers with galvanic isolation.

According to one aspect of the present invention, an electric heating device is provided for a motor vehicle with a dual-voltage vehicle electrical system. The electric heating device comprises a supply connection connectable to a first sub-system of the dual-voltage vehicle electrical system. The electric heating device further comprises an electric heating element and a switching element for controlling a current supply from the supply connection to the heating element. In addition, the heating device comprises a control device connectable to a second sub-system of the dual-voltage vehicle electrical system for providing a control signal for the switching element, where a nominal voltage of the second sub-system is lower than a nominal voltage of the first sub-system, and a capacitive element connected between an output of the control device and a control connection of the switching element, so that the control connection of the switching element is connected via the capacitive element to the control device.

It is the particular approach of the present invention to provide an electric heating device which is operated at a higher voltage in a dual-voltage vehicle electrical system of a motor vehicle and which can be controlled from a sub-system having a lower voltage and without the use of complex technology for galvanic isolation of the voltage regions, such as for example opto-couplers. For this purpose, a control connection of the heating device comprises a capacitive separating element as well as a control device which is integrated into the heating device and which is configured to convert a control specification to the heating device on the part of the sub-system with the lower voltage into a signal which can be transmitted via the capacitive separating element.

The switching element preferably comprises a power transistor. More preferably, it can be a MOSFET. Alternatively, an IGBT can be used as the power transistor. The control connection is then the gate connection of the transistor.

The electric heating device preferably further comprises a rectifier device connected between the capacitive element and the control connection of the switching element.

A power semiconductor (transistor) is conventionally controlled by applying a specific level to a control electrode (gate). However, since no direct voltage but only electrical field changes can be transmitted with a capacitive coupling via a blocking capacitor, an alternating current signal is first received at the control connection. It can be converted by a rectifier device, such as a diode, into a unipolar signal with which the switching device can be controlled directly as is conventionally done.

The electric heating device further preferably comprises a buffer capacitance (a buffer capacitor) which is connected between the control connection of the switching element and ground. Such a buffer capacitor smoothes the signal in which one half-wave is cut off, respectively, by the rectifier device.

The control device is preferably adapted to output an alternating current signal, in particular a high-frequency alternating current signal, of a specific frequency corresponding to a predetermined heating power, which signal is transmitted via the capacitive element.

As stated, a capacitive separating element (capacitor) is unable to transmit a direct current level. If a control command is received from the low-voltage part of the vehicle electrical system (for example, the instruction to heat at a certain percentage, like 33%, of the maximum heating power), then this can be effected, for example, in that the control device receives a corresponding level from a vehicle bus (for example LINBUS). However, it must be converted into an alternating voltage signal, since the blocking capacitor can only transmit field changes. The frequency of the alternating voltage signal can serve as a signal-transmitting parameter which encodes the percentage of the maximum power (or an absolute heating power).

This signal can preferably be processed further in a smoothing circuit formed by a rectifier device and a buffer capacitor on the transistor side of the blocking capacitor. If the buffer capacitor connected between the control connection of the transistor and ground has a large capacitance (large-dimensioned), then the buffer capacitor stores the energy transmitted with the alternating current signal. The smoothing circuit then outputs a signal with an almost constant level for a certain period of time. The period of time is determined by the amount of energy transmitted, which in turn depends on the frequency of the alternating current signal.

The actuation of the heating element via the transistor (switching element) can be simulated in this way in a manner similar to pulse width modulation (PWM). If, for example, an actuation on the high-voltage side is given with a frequency of 50 Hz (Hertz), i.e. 50 control pulses per second, then the duration of one control pulse (time unit) is 20 ms (milliseconds). If e.g. a heating output of 50% is demanded, then the frequency of the alternating current signal must be set such that the smoothing circuit (buffer capacitor) delivers current for 50% of the regular duration of the control pulse, i.e. 10 ms. This corresponds to a PWM duty factor of 50%. The numerical values given here are of course only by way of example and the present invention is in no way restricted thereto. The general rule is that a certain amount of energy must be transmitted with the alternating current signal at a certain frequency such that a current flow from the smoothing circuit takes place for a period of time within a given time unit and corresponds to the desired pulse factor.

However, if a buffer capacitor with only a small capacitance (small-dimensioned) is used, then this corresponds to only a short integration time of the smoothing circuit, as a result of which a pulsating direct current signal is produced which approximately consists of a sequence of rectangular pulses. If the frequency of the alternating current signal is chosen to be sufficiently high, then the transistor remains switched on due to the inertia of its switching process during the entire period of time that the alternating current signal is applied, so that the transistor is actuated like in a conventional actuation, without PWM.

The heating element is preferably a PTC (positive temperature coefficient) heating element, more preferably a PTC heating element designed for a nominal voltage of 48 V.

According to preferred embodiments, the electric heating device comprises several separately actuatable heating elements (heating stages) with several switching elements that are respectively associated. Corresponding to the separate actuation, the control connections of these switching elements are then each connected via separate blocking capacitors to corresponding output connections of the control device, via which the respective control information is transmitted by field changes.

The heating device is therefore actuated via several switching elements which are each actuated from the second sub-system to switch currents in the first sub-system. One of the switching elements is respectively used to switch one heating element or one heating stage of the heating device. A respective heating stage can consist of one or a plurality of heating elements to be actuated jointly, in particular PTC elements. In such a case, a capacitor is provided according to the invention for potential isolation in the respective connection between a control connection of each switching element and the control device in the sub-system with the lower voltage.

A specific heating power can thus be achieved by selectively switching on or off individual heating stages and/or by actuation with a signal similar to a PWM, as described above. If it is not possible or desirable to actuate individual heating stages for a certain partial output similar to a PWM, for example, the individual heating stages can be actuated temporally in succession in cyclical alternation in order to deliver their full heating output for obtaining a partial heating output overall.

If the individual heating stages provide, in particular, different heating powers, then a demanded output can be set by switching certain heating stages on and off. Furthermore, by actuating at least some of the heating stages with a signal similar to a PWM, more finely level setting can be obtained.

The voltages in the first sub-system and in the second sub-system preferably differ significantly by a factor of at least 2, that is to say that the voltage in the first sub-system is several times higher than that in the second sub-system. According to a preferred embodiment, the voltage provided by the voltage source in the first sub-system is in particular four times the voltage provided by the voltage source in the second sub-system. Furthermore, if the voltage source in the second sub-system preferably provides a voltage of 12 volts, then the corresponding voltage from the voltage source in the first sub-system is 48 volts. Such a configuration has the advantage that conventional components that are designed for a 12-volt electrical system can continue to be used for components with lower performance, such as control electronics or injection pump.

The electric heating device preferably also comprises a voltage-controlled oscillator which can be connected to the first sub-system for converting a level into a frequency signal for information transmission from the first sub-system via the capacitive element to the control device.

For optimal control of a heating device, it is preferably necessary for the control device to also receive feedback of information from the heating elements in the region of the higher nominal voltage, such as temperature information. In addition, feedback regarding current and/or voltage information can be helpful.

In order to be able to also transmit such information via the capacitive separating element, such signals, which are conventionally typically also present as constant (voltage) levels, have to be transformed into signals which can be transmitted via the capacitive separating element. According to the invention, a voltage-controlled oscillator is used for this purpose with which a level can be converted into a frequency signal. The level to be converted can in particular be provided by a device for temperature measurement or a device for current measurement, or it can correspond to a voltage level detected at a specific point of the heating device.

The voltage supply of the voltage-controlled oscillator is preferably controlled via an alternating current signal, transmitted from the control device, controlled via the capacitive element, in a manner similar to the voltage supply of the heating element.

According to a further particular aspect of the present invention, a motor vehicle with a dual-voltage vehicle electrical system and a heating device is provided according to the first aspect of the present invention or one of its embodiments. The supply connection is connected to the first sub-system and the control device is connected to the second sub-system.

The control device is preferably connected to a vehicle bus in the second sub-system and receives information about the predetermined heating output from the vehicle bus.

Further advantageous embodiments are the subject matter of the dependent claims.

BRIEF DESCRIPTION OF THE DRAWINGS

The present invention is explained below with reference to preferred embodiments in combination with the accompanying drawings in which.

DETAILED DESCRIPTION OF THE INVENTION

Figure 1:
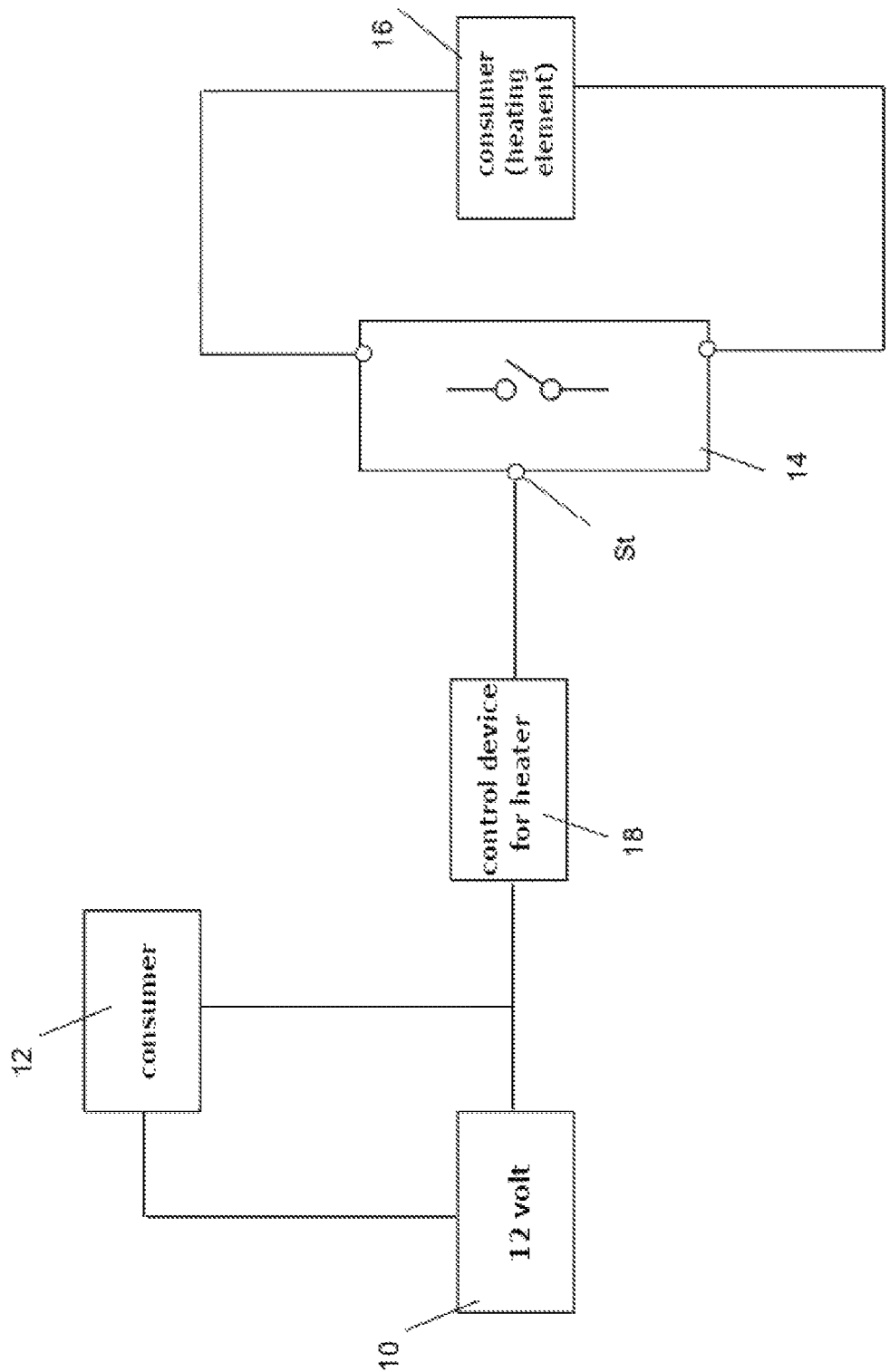
FIG. 1 shows a general diagram of a conventional 12 V motor vehicle electrical system with a heating device.

The following detailed description serves to illustrate the invention by way of selected embodiments and with reference to the drawings. However, the present invention, as defined in the claims, is not restricted to the embodiments described below and in particular to the parameter values mentioned therein by way of example.

In the following illustration, same reference numerals indicate same or at least functionally equivalent components.

FIG. 1 shows a schematic diagram of a conventional motor vehicle electrical system with a battery voltage of 12 V (volts). The voltage supply to the electrical system is provided by a voltage source 10, in particular a vehicle battery (accumulator). Generally, the vehicle electrical system also comprises a generator (not shown in the FIG.) which is used both for recharging the battery and for directly feeding electrical energy into the motor vehicle electrical system during engine operation. The vehicle electrical system comprises a number of consumers (electrical vehicle components such as lighting, injection pumps, entertainment and information electronics equipment, windshield wipers, power window lifters and others). This is shown summarized in the schematic diagram of FIG. 1 in block 12.

In particular a motor vehicle heating device or an air conditioning system is among the consumers, shown separately in block 16 in the FIG. It is generally actuated via a control element 14, in particular a power semiconductor. A control signal generated by a suitable component of control electronics 18 (for example a microcontroller μC) is applied to a control connection St of the switching element (power semiconductor) 14. This enables the power in the sub-system with the heating device to be controlled. Although only a single consumer 16 symbolizing the heating device combined with a single switching element 14 is shown schematically in FIG. 1, the heating device generally consists of a plurality of separately actuatable components (heating stages) which can then be actuated separately via a plurality of switching elements.

With a further increase in the electrical power required to operate individual consumers in the motor vehicle (such as electric motors for various types of auxiliary equipment, generators and heaters, so-called high-current consumers), there is a shift towards designing vehicle electrical systems in such a way that two sub-systems with different voltages are used. Firstly, this can take advantage of the fact that the high-current consumers can be operated with significantly lower currents than in a conventional 12-volt electrical system, so that the necessary cables for large consumers (e.g. PTC heating elements) can be configured to be thinner. Secondly, the conventional components designed for 12 volts can continue to be operated for consumers who do not require high power.

Points of contact of both sub-systems arise from the fact that the control electronics for the high-current consumers, in particular heating/air conditioning devices, continue to be disposed in the region of the sub-system with the lower voltage. In this case, control electronics 18 from the sub-system with the lower voltage controls by applying corresponding voltage signals to control connections St of power semiconductors 14 such that currents in the sub-system with the higher voltage for the high-current consumers are switched via the power semiconductors.

In the event of a fault (when the power semiconductor breaks down), however, such a solution entails the risk that the higher voltage is present in the entire sub-system with the lower voltage and destroys the electronic components there, in particular the control electronics for consumers in the sub-system with the lower voltage such as information electronics or the injection pump and these consumers themselves.

To prevent this, a galvanic isolation is employed in the sub-systems in conventional dual-voltage vehicle electrical systems using opto-couplers (which react quickly) or alternatively inductive couplers (which react much more slowly).

Figure 2:
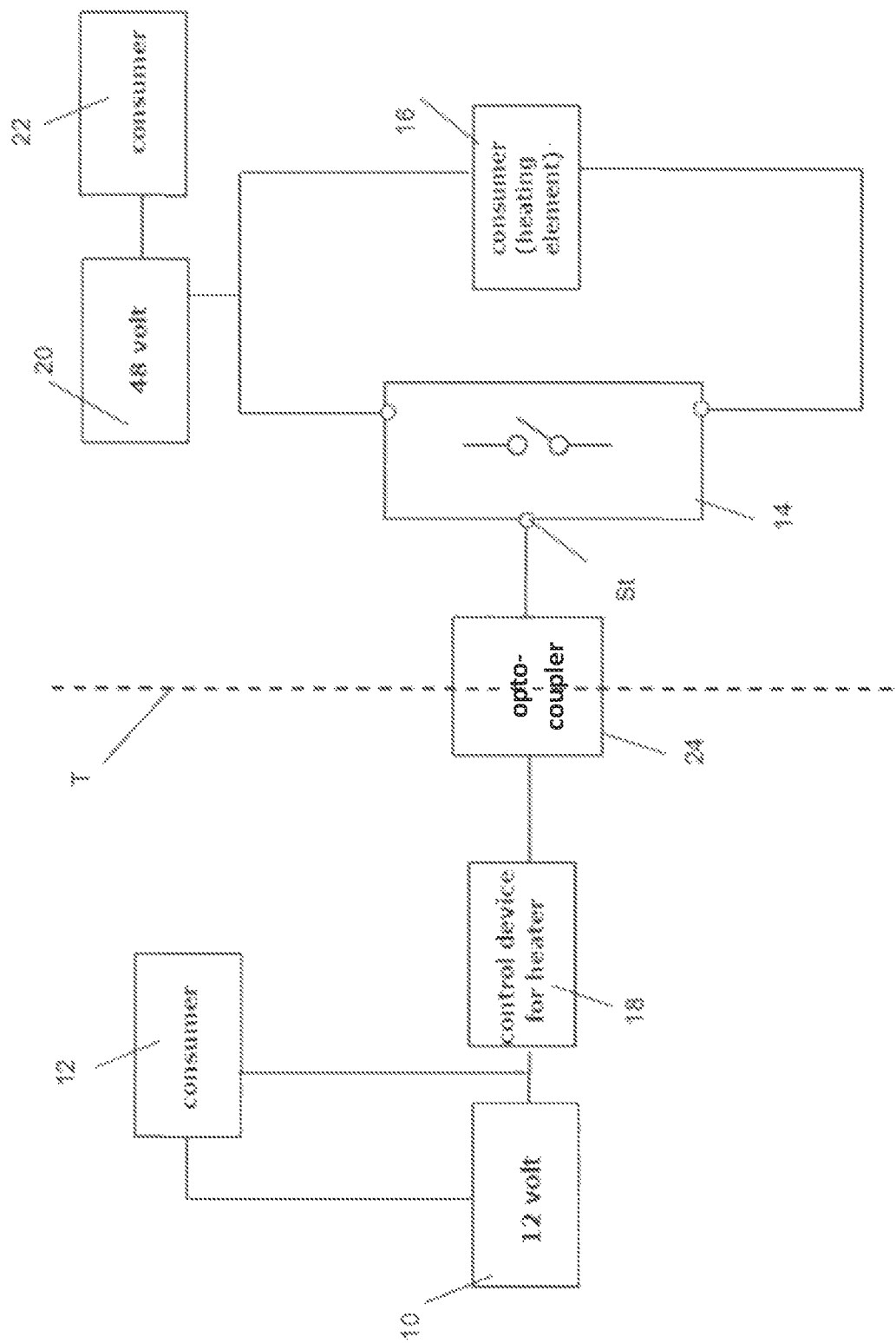
FIG. 2 shows a general diagram of a dual-voltage motor vehicle electrical system with a heating device with galvanic isolation of the sub-systems by way of an opto-coupler.

FIG. 2 is a schematic diagram of a conventional dual-voltage vehicle electrical system with an opto-coupler 24 for the galvanic isolation of the two sub-systems.

On the left-hand side of the drawing is a schematic representation of the sub-system with the lower voltage (again 12 volts as an example). In addition to the voltage source (battery) 10, this part contains, in particular, a number of consumers 12 of low power and components of control electronics 18 which in particular also provide control signals for consumers in the high current/high power region. In particular, control electronics 18 preferably comprise a microcontroller (μC). The sub-system with the higher battery voltage (for example 48 volts) is shown on the right-hand side. In addition to the voltage source 20, there are other consumers (16 and 22) disposed therein. These consumers include in particular a heating device 16, shown separately in the image. Further consumers are summarized in block 22.

The consumers, in particular heating device 16, are actuated via a switching element 14, in particular a power semiconductor (control connection St). For the sake of simplicity, only one power semiconductor 14 in connection with a consumer 16 is shown in the FIG. However, there can be a plurality of switching elements (power semiconductors) in a similar manner for switching a plurality of consumers, for example several heating stages.

The border between the regions with the higher voltage (right-hand side) and the lower voltage (left-hand side) is symbolized in FIG. 2 by the dashed line T. Opto-coupler 24 prevents the voltage of 48 V from reaching through to the 12 V sub-system and thus the destruction of components of this sub-system.

A drawback of using opto-couplers for galvanic isolation of 12 V and 48 V sub-systems is that opto-couplers are expensive components and, moreover, take up too much of the space that is scarce in motor vehicles.

This is particularly true when several separately actuatable heating elements (heating stages) are present, as is explained below with reference to the drawings FIG. 3 and FIG. 4.

Figure 3:
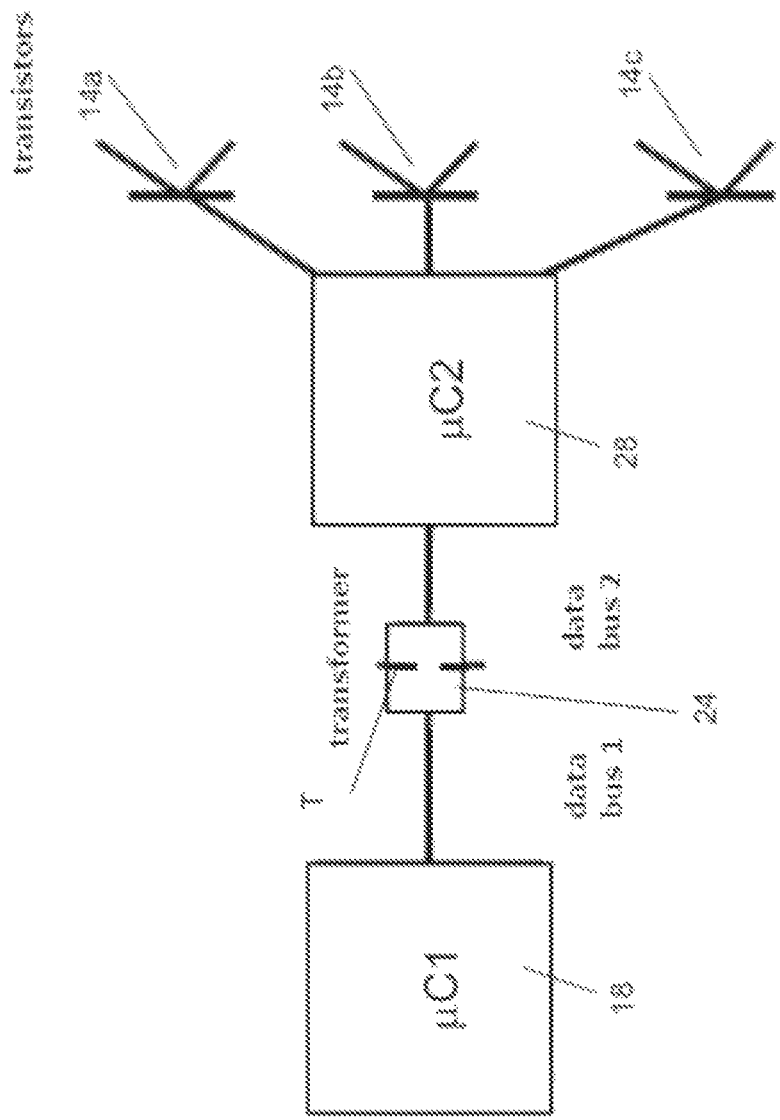
FIG. 3 shows an example of an actuation of a heating device with several heating elements in a dual-voltage vehicle electrical system via a transformer.

In the example in FIG. 3, three heating stages (not shown in the FIG.) are actuated with the aid of three switching elements (transistors 14a, 14b, 14c). The corresponding control signals are output by control device 18 (in the example: a microcontroller, μC1) to a data bus. A transformer 24, for example an opto-coupler, is provided for galvanic isolation. More precisely, transformer 24 is part of the data bus system consisting of data buses 1 and 2 which is used for signal transmission. If, as provided in this example, only a single bus system with a single transformer is provided for data transmission from the control device in the sub-system with the lower voltage (in the example: 12 V) to the transistor which switches currents in the sub-system with the higher voltage (in the example: 48 V), then a further control element (in the example: another microcontroller, μC2) is required on the transistor side from the transformer for being able to actuate the individual transistors separately.

Though the structure shown with a data bus system enables a broad exchange of information between the different potentials, but in addition to the use of expensive transformers/opto-couplers, it causes considerable additional costs for the second microcontroller and the development costs for respective software.

Alternatively, individual actuation of the heating circuits (heating stages) can already be provided from control device 18 provided in the region with the lower voltage. Such an example is shown in FIG. 4.

Control device 18 (again a microcontroller, μC in the example) is there set up for individual actuation of the heating circuits, so that it already outputs separate control signals for the individual heating stages which are then transmitted separately to the corresponding transistors (14a, 14b, 14c). This indeed means that a second microcontroller is not required. Besides a considerably limited possibility of information transmission as compared to a data bus system, such an embodiment has the drawback that a separate transformer/opto-coupler (24a, 24b, 24c) is then required for each transmission channel, which again causes additional costs.

The solution according to the invention was developed for this reason, where a capacitive element (capacitor) is used for potential isolation instead of the galvanic isolation with the opto-coupler.

Figure 5:
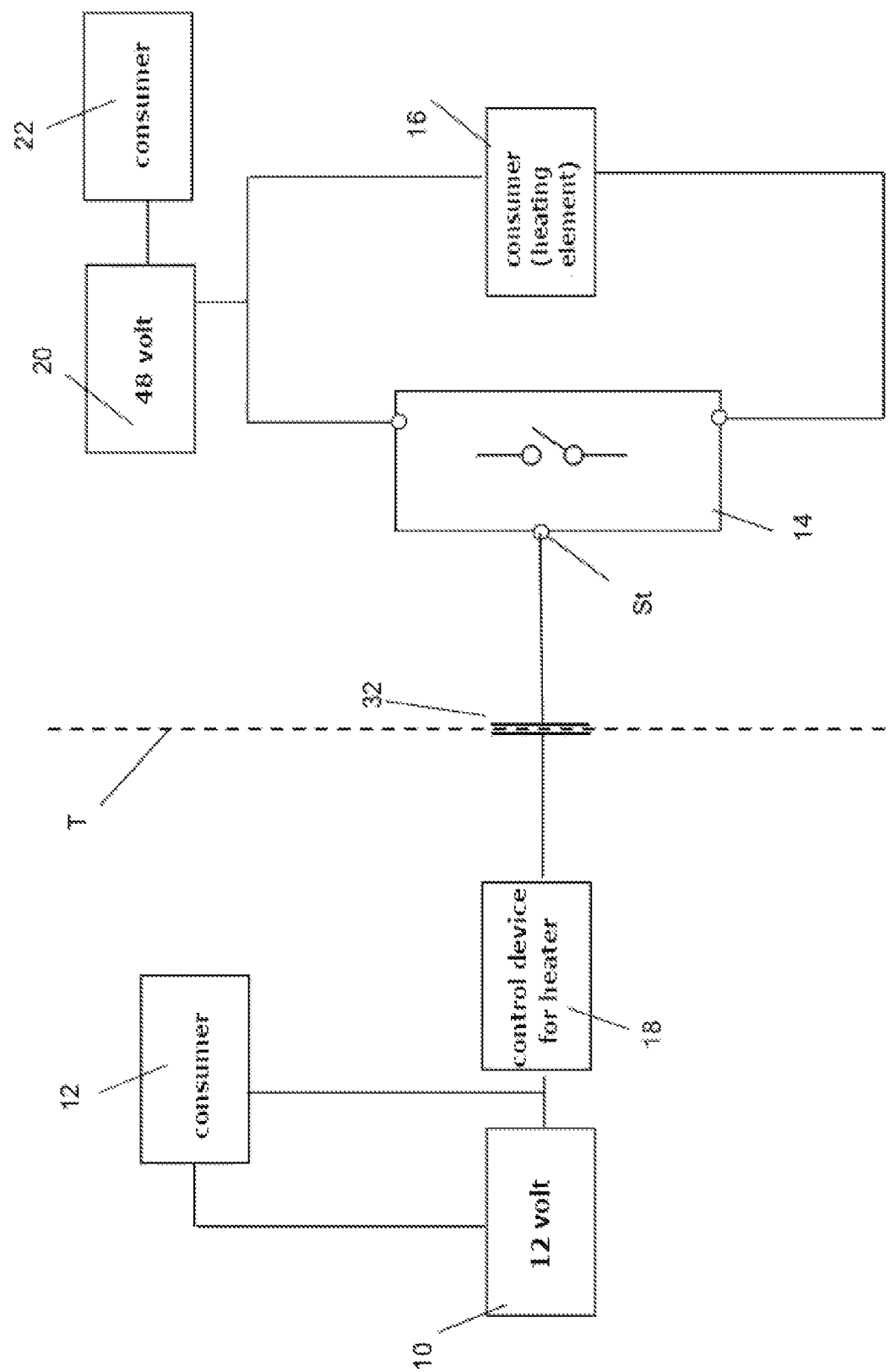
FIG. 5 shows a general diagram of a dual-voltage motor vehicle electrical system with a heating device according to an embodiment of the present invention.

A corresponding embodiment of the present invention is shown schematically in FIG. 5. A renewed detailed description of corresponding elements with the same reference symbols is dispensed with.

Instead of the opto-coupler 24, a capacitive isolating element (capacitor) 32 is connected between control connection St of power semiconductor 14 and the 12 V sub-system, in particular, control electronics 18. A smoothing circuit with a diode as a rectifier device and a buffer capacitor connected to ground is preferably further provided between capacitor 32 and control connection St of transistor 14 (not shown in this FIG.).

Such an arrangement enables communication between different potentials with inexpensive, robust hardware, while at the same time ensuring that the potentials do not come into electrical contact with one another.

In the arrangement according to the invention, the two potentials are therefore only connected by a capacitive coupling via blocking capacitor 32. It can only be used to transmit electrical field changes. Any direct voltage is blocked.

Reliable protection of the components in the 12 V vehicle electrical system is achieved in this way in a simple, inexpensive, and space-saving manner, even without complete galvanic isolation. It is pointed out in particular that the failure rate of capacitors is much lower than that of optocouplers.

Examples of corresponding arrangements are explained below with reference to the drawings in FIGS. 6 and 7.

Figure 4:
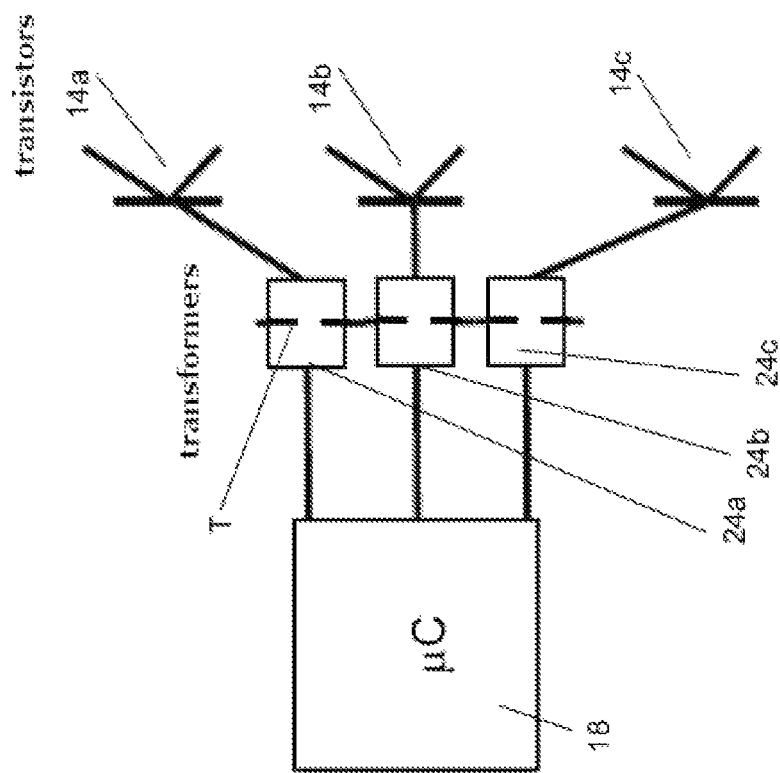
FIG. 4 shows a different example of an actuation of a heating device with several heating elements in a dual-voltage vehicle electrical system using several transformers.
Figure 6:
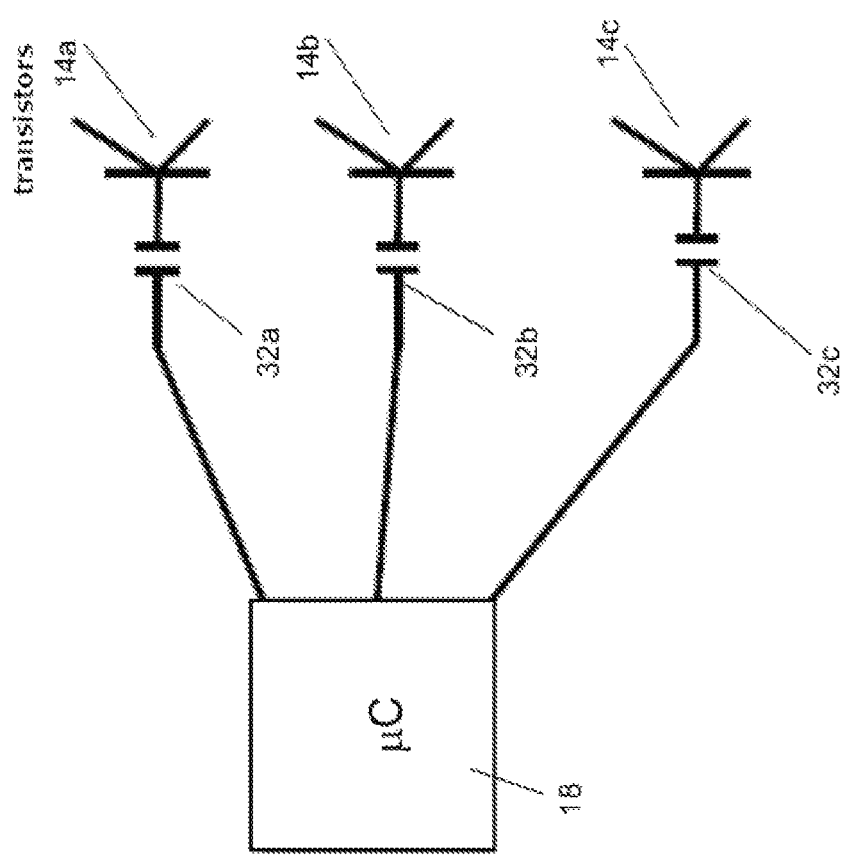
FIG. 6 shows an example of an actuation of a heating device with several heating elements according to embodiments of the present invention.

FIG. 6 shows a diagram for the individual actuation of three heating elements (heating stages or heating circuits, not shown in the FIG.) by a control element (microcontroller μC) 18 by way of three transistors (14a, 14b, 14c), similar to that shown in FIG. 4. According to the invention, however, three blocking capacitors (32a, 32b, 32c) are provided in the individual control paths from the microcontroller 18 to the transistors instead of three transformers (opto-couplers 24a, 24b, 24c).

Figure 7:
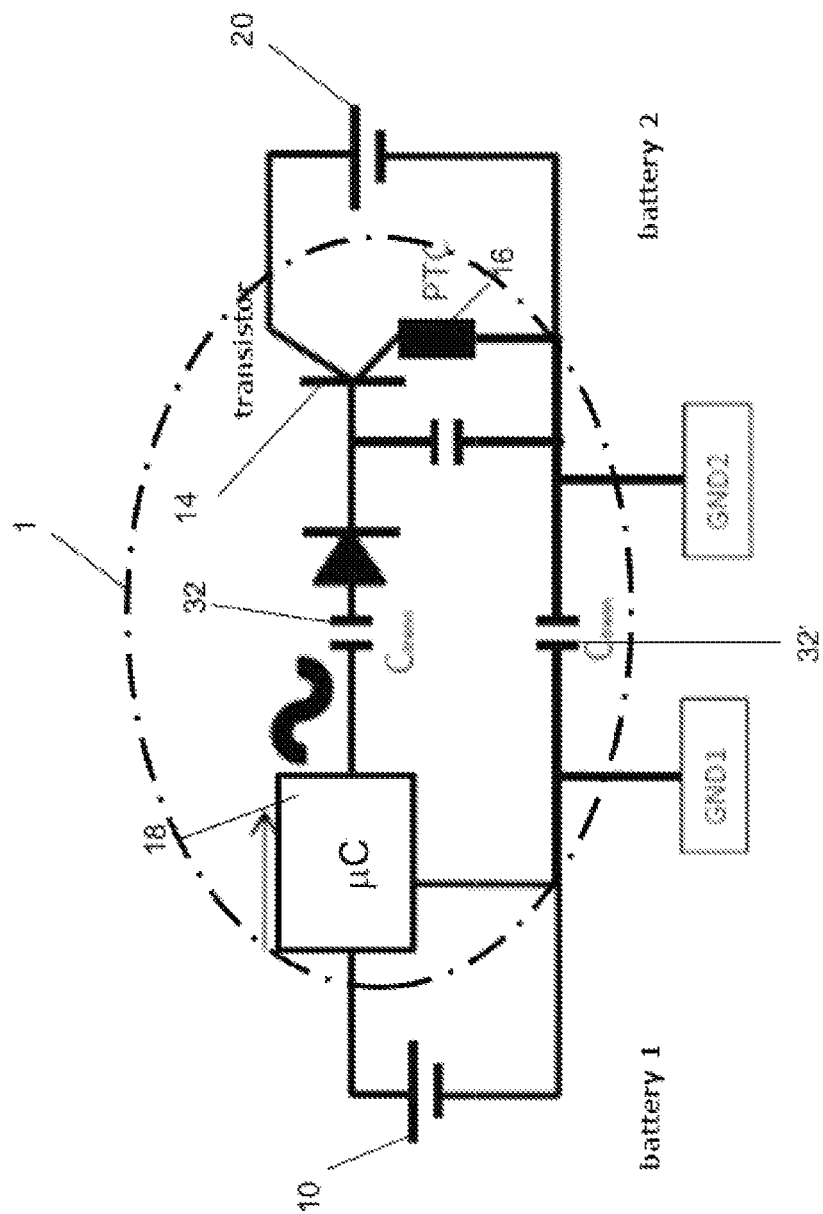
FIG. 7 is a detailed view of a heating device according to embodiments of the present invention.

This is shown in more detail using the example of the actuation of a single PTC heating element 16 in FIG. 7. Of course, this detailed representation can be transferred to the case of several separately actuatable heating circuits, which is here not shown for the sake of simplicity and for better understanding.

As shown in FIG. 7, control device 18 (microcontroller μC) transmits a control signal in the form of an alternating field via blocking capacitor 32 and the smoothing circuit (diode 34 and buffer capacitor 36) to the control connection of transistor 14. The transistor can therewith control a current flow in the first sub-system from battery 20 with the higher nominal voltage to PTC heating element 16. Control device 18 itself is located in the second sub-circuit and is supplied with the lower nominal voltage by battery 10.

Field changes are thus generated by switching the output signal at the microcontroller and smoothed on the other potential side via buffer capacitor 32. The control connection of transistor 14 (base or gate, respectively) supplied in this way switches the former on. Once control device 18 no longer generates switching changes, the transistor shuts off.

FIG. 7 additionally shows an optionally provided second blocking capacitor 32'. It is used for potential isolation if the two sub-systems do not have a common ground. This prevents the potentials of the two sub-systems from coming into contact with one another, even if the grounds differ. In the case of a common ground, second blocking capacitor 32' is not required.

The configuration according to the invention makes due with only a few robust components and also requires little installation space. A heating device 1 according to the invention can therefore be realized in which the additional components required for potential isolation can be accommodated together with the control device within heating device 1, for example, in a control housing attached to the heating register with the PTC heating elements. The components arranged within a heating device 1 according to the invention are summarized in FIG. 7 by a chain line. This enables the provision of a particularly compact motor vehicle heater with supply connections in a sub-system with a higher system voltage, and controllable from a sub-system with a lower system voltage, for example by way of a vehicle bus.

Figure 8:
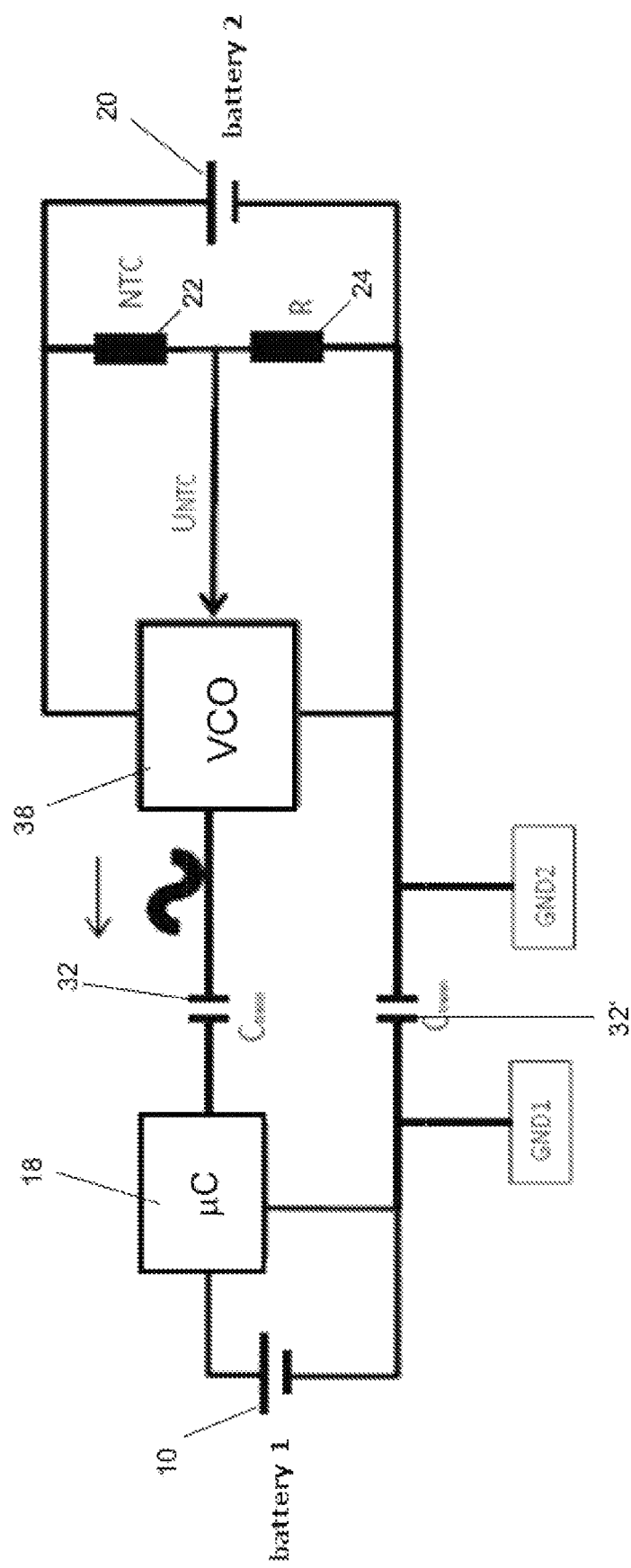
FIG. 8 is a schematic view showing the transmission of temperature information from the region of higher nominal voltage to a control device in the region of lower nominal voltage in an embodiment of a heating device according to the invention.

If information from the heating register (from the region of the heating elements) is additionally to be transmitted back to the control device (which is desirable in practice), then it must also be taken into account in the solution according to the invention that no direct voltage signals can be transmitted via a capacitive separating element. An example of how this can be implemented within the framework of the present invention is shown in FIG. 8 using the example of the transmission of measurement results from a temperature measurement.

According to the invention, a voltage-controlled oscillator 38 (VCO) is provided for this purpose in the first sub-system.

For temperature measurement, a voltage divider is also provided which comprises a temperature-dependent resistor 22 (resistor with negative temperature coefficient, NTC) and a conventional resistor 24 (R). Voltage-controlled oscillator 38 converts the voltage drop via NTC resistor 22 into a frequency signal since only electrical field changes can again be transmitted via capacitor 32 in the capacitive coupling of the two sub-systems. The field changes are generated by the switching in voltage-controlled oscillator 38 and transfer to the other potential side via blocking capacitor 32. In other words, voltage-controlled oscillator 38 generates a frequency map from the direct current level from the voltage divider ($U_{NTC}$).

A corresponding procedure for transporting information from the first to the second sub-system can be transferred accordingly, for example, to voltage or current measurements.

When measuring the voltage of battery 20, the positive terminal of the battery is connected directly to the voltage-controlled oscillator. Switching on the voltage supply for the oscillator is done in exactly the same way as switching on the transistor for actuating the heating element.

For current measurement, for example, the voltage drop is converted into frequency via the shunt or the I-Sense pin of a smart MOSFET.

Figure 9:
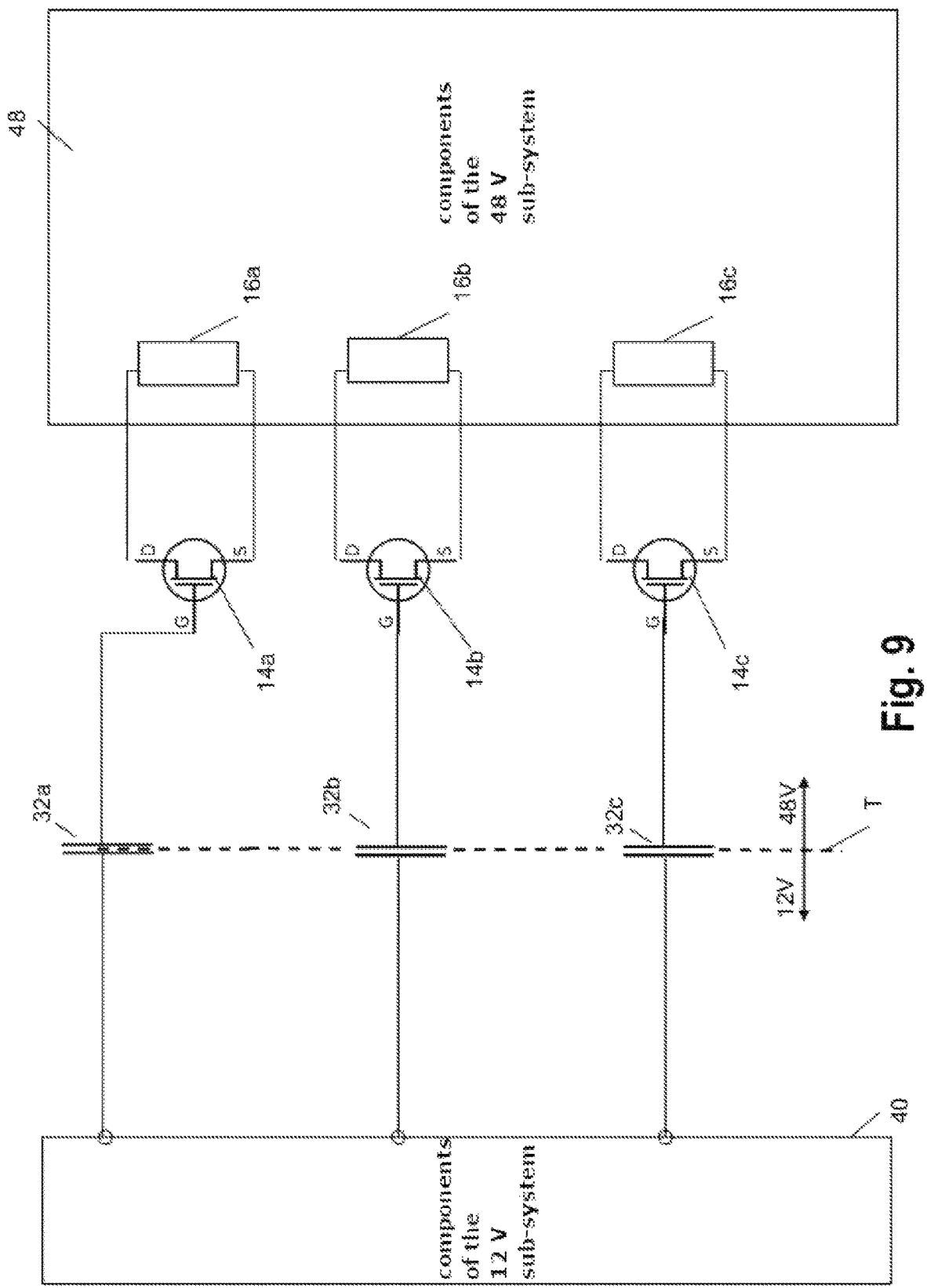
FIG. 9 shows a detailed view of a heating device of the invention according to an embodiment with a total of three power semiconductors and three capacitors for electrical isolation.

A further exemplary illustration of a heating device according to the invention in a dual-voltage vehicle electrical system is shown in FIG. 9.

Three different consumers controlled from the 12 V sub-system but located in the 48 V sub-system, e.g. three different heating stages 16a, 16b and 16c are shown there by way of example. Each of the heating stages is assigned its own switching element (power semiconductor) 14a, 14b, 14c whose electrodes S (source) and D (drain) (connections of the high-current consumers) are connected to the respective consumer (heating element or heating stage). A control electrode G (gate; corresponds to the control connection St in FIG. 3) is connected via a corresponding capacitance 32a, 32b, 32c to the 12 V sub-system, in particular an output of control device (microcontroller) 18. Smoothing circuits, as shown in FIG. 7, are preferably again provided between the transistor-side connections of capacitors (32a, 32b, 32c) and respective transistors (14a, 14b, 14c) (not shown in FIG. 9).

The remaining components of the 12 V and 48 V sub-systems are only shown schematically in blocks 40 and 48. The boundary between the sub-system regions with 12 V and 48 V is again symbolized by the dashed dividing line T.

In the event of a malfunction, when even only one of the power semiconductors breaks down, the circuit according to the invention therefore makes it possible that the 12 V sub-system is protected from being reached by a voltage in the range of 48 V.

In summary, the present invention relates to a heating device for a motor vehicle with a dual-voltage vehicle electrical system. The heating device is operated with a power supply from the sub-system with the higher nominal voltage (for example 48 V), but actuated by a control device in the sub-system with the lower nominal voltage (for example 12 V). For this purpose, the heating device has a supply connection in the sub-system with the higher nominal voltage and a control connection in the sub-system with the lower nominal voltage. The control connection is disposed in particular on a control device which is integrated into the heating device and which is connected to a control connection of a switching element (power semiconductor) for controlling the heating device via a capacitive separating element in order to ensure potential isolation of the two sub-systems.

The invention claimed is:

1. An electric heating device for a motor vehicle with a dual-voltage vehicle electrical system, wherein the dual-voltage vehicle electrical system comprises a first sub-system with a voltage source having a first nominal voltage and a second sub-system with a voltage source having a second nominal voltage, wherein the nominal voltage of said second sub-system is lower than the nominal voltage of said first sub-system, said electric heating device comprising:
    a supply connection connectable to the first sub-system of said dual-voltage vehicle electrical system,
    an electric heating element,
    a switching element for controlling a current supply from said supply connection to said heating element,
    a control device connectable to the second sub-system of said dual-voltage vehicle electrical system for providing a control signal for said switching element,
    a capacitive element connected between an output of said control device and a control connection of said switching element, so that said control connection of said switching element is connected via said capacitive element to said control device, and
    a rectifier device connected between said capacitive element and said control connection of said switching element.

2. The electric heating device according to claim 1, wherein said switching element is a power transistor and said control connection is a gate connection.

3. The electric heating device according to claim 1, further comprising a buffer capacitance connected between said control connection of said switching element and a ground connection.

4. The electric heating device according to claim 3, wherein
    said control device is adapted to output an alternating current signal of a specific frequency corresponding to a predetermined heating power, which signal is transmitted via said capacitive element and
    wherein said buffer capacitance is dimensioned such that alternating current signal is converted into a pulsating direct current signal for actuating a control electrode.

5. The electric heating device according to claim 3, wherein
    said control device is adapted to output an alternating current signal of a specific frequency corresponding to said predetermined heating power, which signal is transmitted via said capacitive element and
    wherein said buffer capacitance is dimensioned such that said alternating current signal is converted into a direct current signal having an approximately constant level, where said direct current signal is an output for a certain period of time according to said frequency of the alternating current signal.

6. The electric heating device according to claim 1, comprising a plurality of heating elements and a corresponding plurality of switching elements whose control connections are connected via a corresponding plurality of capacitive elements to a corresponding plurality of outputs of said control device, so that said individual heating elements are controllable individually by said control device.

7. The electric heating device according to claim 1, further comprising a voltage-controlled oscillator connectable to said first sub-system for converting a level into a frequency signal for information transmission from said first sub-system via said capacitive element to said control device.

8. The electric heating device according to claim 7,
    further comprising a device for temperature measurement in a region of said first sub-system,
    wherein said voltage-controlled oscillator is configured to convert said level into said frequency signal which corresponds to a measurement result of said temperature measuring device.

9. The electric heating device according to claim 7,
    further comprising a device for current measurement in a region of said first sub-system,
    wherein said voltage-controlled oscillator is configured to convert said level into said frequency signal which corresponds to a measurement result of said current measuring device.

10. The electric heating device according to claim 7, wherein said control device is further configured to control a voltage supply for said voltage-controlled oscillator by way of an alternating current signal which is transmitted via said capacitive element to said voltage-controlled oscillator.

11. The electric heating device according to claim 1, wherein said heating element is a PTC heating element.

12. A motor vehicle with
    a dual-voltage vehicle electrical system and
    an electric heating device according to claim 1, wherein the supply connection is connected to said first sub-system and said control device to said second sub-system.

13. The motor vehicle according to claim 12, wherein said control device is connected to a vehicle bus in said second sub-system and receives information about a predetermined heating power from said vehicle bus.

* * * * *